United States Patent
Tachikawa et al.

(10) Patent No.: US 6,171,749 B1
(45) Date of Patent: Jan. 9, 2001

(54) NEGATIVE-WORKING CHEMICAL-AMPLIFICATION PHOTORESIST COMPOSITION

(75) Inventors: Toshikazu Tachikawa, Yokohama; Fumitake Kaneko, Hiratsuka; Satoshi Fujimura, Kanagawa-ken; Miwa Miyairi, Kanagawa-ken; Hiroshi Komano, Kanagawa-ken; Toshimasa Nakayama, Chigasaki, all of (JP)

(73) Assignee: Tokyo Ohka Kogyo Co., Ltd., Kanagawa-ken (JP)

( * ) Notice: Under 35 U.S.C. 154(b), the term of this patent shall be extended for 0 days.

(21) Appl. No.: 09/239,798

(22) Filed: Jan. 29, 1999

(30) Foreign Application Priority Data

Feb. 4, 1998 (JP) .................................. 10-023182

(51) Int. Cl.$^7$ ........................................ G03F 7/004
(52) U.S. Cl. ................ 430/170; 430/270.1; 430/905
(58) Field of Search ........................ 430/270.1, 905, 430/170

(56) References Cited

U.S. PATENT DOCUMENTS

| | | | |
|---|---|---|---|
| 5,034,304 | 7/1991 | Feely | 430/270.1 |
| 5,204,225 | 4/1993 | Feely | 430/325 |
| 5,298,364 * | 3/1994 | Pawlowski et al. | 430/280.1 |
| 5,424,166 | 6/1995 | Pawlowski et al. | 430/157 |
| 5,629,135 * | 5/1997 | Kobayashi et al. | 430/270.1 |
| 5,789,136 | 8/1998 | Sato et al. | 430/270.1 |
| 5,817,444 * | 10/1998 | Sato et al. | 430/155 |
| 5,955,241 * | 9/1999 | Sato et al. | 430/270.1 |
| 5,981,139 * | 11/1999 | Tomo | 430/270.1 |
| 6,090,518 * | 7/2000 | Niiinomi et al. | 430/170 |

FOREIGN PATENT DOCUMENTS 9-311451   12/1997   (JP) .

* cited by examiner

*Primary Examiner*—John S. Chu
(74) *Attorney, Agent, or Firm*—Wenderoth, Lind & Ponack, L.L.P.

(57) ABSTRACT

Disclosed is a novel negative-working chemical-amplification photoresist composition comprising, as the essential ingredients, (A) an alkali-soluble resin, (B) a radiation-sensitive acid-generating agent and (C) a cross-linking agent. Characteristically, the component (B) is a combination of a halogenoacid-generating compound and a bis(alkylsulfonyl) diazomethane compound in a specified proportion. By virtue of this unique formulation of the composition, the photoresist composition can give a patterned resist layer having excellently orthogonal cross sectional profile in a high photosensitivity.

14 Claims, No Drawings

NEGATIVE-WORKING CHEMICAL-AMPLIFICATION PHOTORESIST COMPOSITION

BACKGROUND OF THE INVENTION

The present invention relates to a novel negative-working chemical-amplification photoresist composition or, more particularly, to a negative-working chemical-amplification photoresist composition capable of giving a finely patterned resist layer on a substrate surface having an excellently orthogonal cross sectional profile with high photosensitivity.

As is well known photoresist compositions used for forming a patterned resist layer in the manufacture of semiconductor devices and liquid-crystal display devices include positive-working photoresist compositions as a class giving a positively patterned resist layer by dissolving away the resist layer in the areas exposed to the light in the development treatment with a developer solution and negative-working photoresist compositions as the other class giving a negatively patterned resist layer by dissolving away the resist layer in the areas unexposed to the light in the development treatment. The negative-working chemical-amplification photoresist composition as the subject matter of the present invention is a negative-working photoresist compositions comprising an alkali-soluble resin, a compound capable of releasing an acid by the irradiation with actinic rays and a crosslinking agent for the resin.

In the photoresist composition of this type, the crosslinking reaction of the resinous ingredient is greatly promoted by the catalytic activity of the acid released from the radiation-sensitive acid-generating agent to give a high photosensitivity of patterning and a patterned resist layer of high pattern resolution can be obtained by development with an alkaline developer solution. By virtue of these advantages, the negative-working chemical-amplification photoresist compositions are now widely employed for patterning in the manufacture of semiconductor devices and liquid-crystal display devices.

Various kinds of compounds are known as the radiation-sensitive acid-generating agent used in the photoresist composition of this type including isocyanurate ester compounds such as tris(2,3-dibromopropyl) isocyanurate and the like disclosed in Japanese Patent Publication 8-3635.

This isocyanurate ester compound, which generates a halogenoacid when irradiated with the KrF excimer laser beam having a wavelength of 248 nm, is highly transparent to this laser beam to give a patterned resist layer having an excellently orthogonal cross sectional profile so that the compound is used in negative-working photoresist compositions for patterning with KrF excimer laser beams as well as in negative-working resist compositions for patterning by irradiation with electron beams and X-rays.

Along with the trend in recent years toward increasing compactness of various kinds of electronic instruments and increasingly high degree of integration in semiconductor devices, however, photoresist compositions are required to have a still higher sensitivity and to give a still improved resolution and the above mentioned negative-working chemical-amplification photoresist compositions formulated with the isocyanurate ester compound as the radiation-sensitive acid-generation agent can no longer comply with this requirement, in particular, in respect of the sensitivity. Accordingly, it is eagerly desired to develop a negative-working photoresist composition capable of exhibiting a high sensitivity even to the KrF excimer laser beam irradiation.

Japanese Patent Kokai 4-217249 discloses, as an acid-generating agent, use of diazomethane compounds such as bis(cyclohexylsulfonyl) diazomethane, bis(4-tert-butylphenyl-sulfonyl) diazomethane and the like in negative-working photoresist compositions. Though improved to some extent in the sensitivity, these photoresist compositions are still unsatisfactory in respect of the orthogonality of the cross sectional profile of the patterned resist layer obtained therefrom as compared with the photoresist compositions formulated with a halogenoacid-generating agent such as tris(2,3-dibromopropyl) isocyanurate and the like.

Further, Japanese Patent Kokai 8-292564 discloses a great variety of radiation-sensitive acid-generating compounds such as certain halogenoacid-generating compounds, bis (alkylsul-fonyl) diazomethanes and the like but nothing is suggested on the combined use of these acid-generating compounds in a specified proportion.

Besides, Japanese Patent Kokai 9-311451 discloses a negative-working photoresist composition containing a halogenoacid-generating compound and an onium salt-based acid generating compound in combination as the radiation-sensitive acid-generating agent but this photoresist composition has a disadvantage that, due to the unduly high acid strength of the acid released from the onium salt, the crosslinking reaction of the resinous ingredient is not limited to the exposed areas but extended to the areas unirradiated with the actinic rays not to give an excellently patterned resist layer.

SUMMARY OF THE INVENTION

The present invention accordingly has an object to provide, by overcoming the above described problems and disadvantages in the prior art, a novel and improved negative-working chemical-amplification photoresist composition capable of giving a patterned resist layer having an excellently orthogonal cross sectional profile with high sensitivity to the patterning light to be used in the manufacturing process of semiconductor devices and liquid-crystal display devices in which a high throughput or high productivity of the products is an essential requirement.

The negative-working chemical-amplification photoresist composition, developed as a result of the extensive investigations undertaken by the inventors with the above mentioned object, is based on an unexpected discovery that the problems in the prior art can be solved by the use of a halogenoacid-generating compound and a specific diazomethane compound in combination in a specified proportion as the radiation-sensitive acid-generating agent.

Thus, the negative-working chemical-amplification photoresist composition of the present invention is a uniform blend which comprises:

(A) an alkali-soluble resin;
(B) an acid-generating agent capable of releasing an acid by irradiation with actinic rays; and
(C) a crosslinking agent, the acid-generating agent as the component (B) being a combination of a halogenoacid-generating compound and a bis(alkylsulfonyl) diazomethane compound in a proportion in the range from 20:1 to 1:2 by weight.

DETAILED DESCRIPTION OF THE PREFERRED EMBODIMENTS

The alkali-soluble resin as the component (A) in the inventive photoresist composition can be selected without particular limitations from those conventionally used in negative-working chemical-amplification photoresist compositions as a film-forming ingredient. Particular examples of the alkali-soluble resin include phenol novolak resins, cresol novolak resins and polyhydroxystyrene resins and derivatives thereof. Derivatives of polyhydroxystyrene resins include, besides homopolymers of hydroxystyrene monomer, copolymers of hydroxystyrene with a comonomer such as acrylic acid esters, methacrylic acid esters, acrylonitrile, methacrylonitrile, styrene, a-methyl styrene, p-methyl styrene, o-methyl styrene, p-methoxy styrene, p-chlorostyrene and the like and hydrogenated resins derived from a homopolymer of hydroxystyrene and copolymers of hydroxystyrene with a (meth)acrylic acid ester or a styrene monomer. Polyhydroxystyrene resins substituted for a part of the hydroxyl hydrogen atoms with alkali solubility-reducing groups capable of dissociation in the presence of an acid can also be used as the component (A).

The above mentioned alkali solubility-reducing group capable of dissociation in the presence of an acid is exemplified by tert-butyl group, tert-butyloxycarbonyl group, tert-amyloxycarbonyl group, ethoxyethyl group, methoxypropyl group, tetrahydropyranyl group, tetrahydrofuranyl group, benzyl group, trimethylsilyl group and the like, of which tert-butyloxycarbonyl group is preferred in respect of the good balance between the acid-dissociability and the alkali solubility-reducing activity to give an excellently orthogonal cross sectional profile of the patterned resist layer. The degree of substitution of these acid-dissociable alkali solubility-reducing groups for the hydroxyl groups in the polyhydroxystyrene resin is in the range from 1 to 45% or, preferably, from 5 to 15%. When the degree of substitution is too low, the alkali solubility-reducing effect is insufficient as a matter of course resulting in an increased film thickness reduction by development. When the degree of substitution is too high, on the other hand, the resist layer has an unduly decreased solubility in an aqueous alkaline solution so that the resist layer even in the unexposed areas cannot be dissolved away by the alkaline developer solution not to accomplish patterning of the resist layer.

Alternatively, an alkali soluble resin having reduced alkali solubility can be a polyhydroxystyrene resin substituted for a part of the hydroxyl groups by sulfonic acid ester groups and carboxylic acid ester groups such as p-acetoaminobenzene sulfonyl group, benzene sulfonyl group, p-chlorobenzene sulfonyl group, naphthylbenzene sulfonyl group, p-acetoaminobenzene carbonyl group, benzene carbonyl group, p-chlorobenzene carbonyl group, naphthylbenzene carbonyl group and the like. The degree of substitution in this case is in the range from 0.01 to 10% or, preferably, from 0.1 to 5.0%. When the degree of substitution is too high, the resist layer has an unduly decreased solubility in an aqueous alkaline solution so that the resist layer even in the unexposed areas cannot be dissolved away by the alkaline developer solution not to accomplish patterning of the resist layer.

Among the above described various alkali-soluble resins, which can be used either singly or as a combination of two kinds or more according to need, a particularly preferable resin is a copolymer of hydroxystyrene and styrene consisting of from 70 to 95% by moles of the hydroxystyrene units and from 30 to 5% by moles of the styrene units and having a weight-average molecular weight in the range from 2000 to 4000.

The component (B) in the inventive photoresist composition is a radiation-sensitive acid-generating agent which is a combination of a halogenoacid-generating compound and a bis(alkylsulfonyl) diazomethane compound in a specified proportion. A typical example of the halogenoacid-generating compound is a tris(halogenoalkyl) isocyanurate compound represented by the general formula

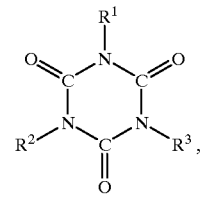

(I)

in which $R^1$, $R^2$ and $R^3$ are each, independently from the others, a halogenated alkyl group.

The above mentioned halogenated alkyl group represented by $R^1$, $R^2$ or $R^3$ is preferably an alkyl group having 1 to 5 carbon atoms and substituted for one or more of the hydrogen atoms by an atom or atoms of a halogen, i.e. fluorine, chlorine, bromine or iodine or, preferably, chlorine or bromine. When the halogenated alkyl group has two or more halogen atoms, they can be of the same kind or can be of different kinds.

Examples of particularly preferable tris(halogenoalkyl) isocyanurate compounds, which can be used either singly or as a combination of two kinds or more as the halogenoacid-generating compound, include tris (2,3-dibromopropyl) isocyanurate and tris(2,3-dibromo-4-chlorobutyl) isocyanurate.

In the bis(alkylsulfonyl) diazomethane compound, which is used in combination with the above described halogenoacid-generating compound, the alkyl group is preferably a straightly linear, branched or cyclic alkyl group having 3 to 7 carbon atoms. Examples of preferable diazomethane compounds, which can be used either singly or as a combination of two kinds or more according to need, include bis(tert-butylsulfonyl) diazomethane, bis(n-butylsulfonyl) diazomethane, bis(isobutylsulfonyl) diazomethane, bis(isopro-pylsulfonyl) diazomethane, bis(n-propylsulfonyl) diazomethane, bis(cyclohexylsulfonyl) diazomethane and the like, of which bis(cyclohexylsulfonyl) diazomethane is particularly preferable due to the high transparency to the KrF excimer laser beam of 248 nm wavelength to give a high resolution of the patterned resist layer.

The weight proportion of the amounts of the above described halogenoacid-generating compound and the bis (alkyl-sulfonyl) diazomethane compound used in combination in the inventive photoresist composition is preferably in the range from 20:1 to 1:2 or, more preferably, in the range from 10:1 to 10:8 in consideration of the sensitivity of the photoresist composition, orthogonality of the cross sectional profile of the patterned resist layer and storage stability of the photoresist composition. When the weight proportion of the latter compound is too small, no good improvement can be accomplished in the sensitivity of the photoresist composition along with a relatively poor orthogonality of the cross sectional profile of the patterned resist layer. When the amount of the latter compound is excessively increased, the photoresist composition would suffer a decrease in the storage stability due to the limited solubility of the compound.

The component (C) in the inventive photoresist composition is a crosslinking agent for the resinous ingredient as the component (A) and can be selected, without particular limitations, from those conventionally used in the negative-working chemical-amplification photoresist compositions. Examples of suitable crosslinking agents include melamine resins and urea resins methylolated or alkoxymethylated at the N-positions.

Although these crosslinking agents can be used either singly or as a combination of two kinds or more according to need, it is preferable to use a melamine resin and a urea resin in combination in a weight proportion, preferably, in the range from 20:80 to 1:99.

The above mentioned methylolated melamine or urea resin can be obtained by the reaction of melamine or urea with formaldehyde in boiling water according to a known procedure. The alkoxymethylated melamine or urea resin can be obtained by the reaction of the above obtained methylolated melamine or urea resin with a lower alcohol.

Though optional, it is advantageous that the photoresist composition of the invention further contains, besides the above described components (A), (B) and (C), a secondary or tertiary amine compound as a component (D) with an object to prevent extraneous diffusion of the radiation-sensitively generated acid so as to improve the fidelity of the patterned resist layer to the photomask pattern. Examples of suitable secondary amine compound include aliphatic secondary amines or dialkylamines such as diethylamine, dipropylamine, dibutylamine, dipentylamine and the like. Examples of suitable tertiary amine compound include trialkyl amines such as trimethylamine, triethylamine, tripropylamine, tributylamine, tripentylamine, N,N-dimethyl propylamine, N-methyl-N-ethyl butylamine and the like, alkanol amines such as N,N-dimethyl monoethanolamine, N,N-diethyl monoethanolamine, triethanolamine and the like, and aromatic tertiary amines such as N,N-dimethylaniline, N,N-diethylaniline, N-ethyl-N-methyl aniline, N,N-dimethyltoluidine, N-methyl diphenylamine, N-ethyl diphenylamine, triphenylamine and the like. Among these amine compounds, which can be used either singly or as a combination of two kinds or more according to need, aliphatic tertiary amine compounds are preferable and, in particular, trialkyl amine compounds of which the alkyl groups each have 2 to 4 carbon atoms, e.g., triethylamine, tripropylamine and tributylamine, are more preferable.

It is also optional that the photoresist composition of the invention containing the above described amine compound further contains a carboxylic acid compound as a component (E) with an object to compensate the adverse effect of the component (D) on the sensitivity of the photoresist composition and to further improve the patterning resolution. Suitable carboxylic acid compound include saturated aliphatic carboxylic acids, alicyclic carboxylic acids and aromatic carboxylic acids exemplified by butyric acid, isobutyric acid, malonic acid, succinic acid, glutaric acid and adipic acid as the examples of the saturated aliphatic carboxylic acid which can be monobasic or polybasic, 1,1-cyclohexane dicarboxylic acid, 1,2-cyclohexane dicarboxylic acid, 1,3-cyclohexane dicarboxylic acid, 1,4-cyclohexane dicarboxylic acid and 1,1- cyclohexane diacetic acid as the examples of the alicyclic carboxylic acid and 2-, 3- and 4-hydroxy benzoic acids, 2-hydroxy-3-nitro benzoic acid, phthalic acid, terephthalic acid and isophthalic acid as the examples of the aromatic carboxylic acid which can be monobasic or polybasic and preferably has a substituent group such as hydroxyl and nitro groups, of which the aromatic carboxylic acid compounds are preferable in respect of the adequate acid strength and 2-hydroxy benzoic acid is more preferable in respect of the good solubility in the organic solvent used in the preparation of the photoresist composition and good compatibility with various materials of the substrate to give an excellently patterned resist layer. These carboxylic acid compounds can be used either singly or as a combination of two kinds or more according to need.

It is important that the photoresist composition of the invention is prepared by compounding the above described essential and optional components (A) to (E) as uniformly dissolved in an organic solvent each in a specified proportion. Relative to 100 parts by weight of the component (A), the amount of the component (B) is in the range from 0.5 to 30 10 parts by weight or, preferably, from 1 to 10 parts by weight and the amount of the component (C) is in the range from 3 to 70 parts by weight or, preferably, from 10 to 50 parts by weight. When the amount of the component (B) is too small, complete image formation in patterning of the resist layer cannot be ensured while, when the amount thereof is too large, a uniform photoresist composition can hardly be obtained along with a decrease in the developability of the resist layer after pattern-wise exposure to light. When the amount of the component (C) is too small, good pattern formation of the resist layer cannot be ensured and, when the amount thereof is too large, a decrease is resulted in the developability of the resist layer.

The amount of the component (D) optionally added to the inventive photoresist composition is, when added, in the range from 0.001 to 10 parts by weight or, preferably, from 0.01 to 1.0 part by weight per 100 parts by weight of the component (A) in order to prevent excessive diffusion of the acid generated by the exposure to actinic rays through the photoresist layer so as to improve the fidelity of the resist pattern to the photomask pattern. The amount of the component (E) to be used in combination with the component (D) is in the range from 0.001 to 10 parts by weight or, preferably, from 0.01 to 1.0 part by weight per 100 parts by weight of the component (A) in order to prevent degradation of the photosensitivity due to the component (D) and to improve pattern resolution.

As is mentioned before, the photoresist composition of the present invention is prepared and used usually in the form of a uniform solution of the respective components in an organic solvent. Examples of suitable organic solvents include ketone solvents such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane, ester solvents such as methyl lactate, ethyl lactate, methyl acetate, ethyl acetate, butyl acetate, methyl pyruvate, ethyl pyruvate, methyl methoxypropionate and ethyl ethoxypropionate and amide solvents such as N,N-dimethyl formamide, N,N-dimethyl acetamide and N-methyl-2-pyrolidone. These organic solvents can be used either singly or as a mixture of two kinds or more according to need.

It is of course optional, if so desired, that the above described photoresist composition of the invention is further admixed with various kinds of known additives used in conventional photoresist compositions including auxiliary resins, plasticizers, stabilizers, coloring agents and surface active agents with an object to further improve the properties of the resist layer.

The procedure for obtaining a patterned resist layer from the inventive photoresist composition is not particularly different from that by using a conventional photoresist composition. For example, a substrate such as a semiconductor silicon wafer is uniformly coated with the photoresist composition in the form of a solution on a suitable coating machine such as spinners followed by drying to give a dried photoresist layer. The thus formed photoresist layer is patternwise exposed to actinic rays such as ultraviolet light, deep-ultraviolet light, excimer laser beams and X-rays through a patterned photomask on a minifying projection exposure machine or by scanning of electron beams followed by a heat treatment to build up a latent image which can be developed in a development treatment by using a developer solution which is an aqueous alkaline solution of tetramethylammonium hydroxide in a concentration of 1 to 10% by weight to give a patterned resist layer having good fidelity to the photomask pattern.

The substrate material to which the negative-working chemical-amplification photoresist composition is not particularly different from those used for the conventional negative-working photoresist compositions including, for example, semiconductor silicon wafers optionally provided on the surface with an antireflection coating film of an organic or inorganic material and glass plates. In particular, the result of patterning by using the inventive photoresist composition is excellent on a semiconductor silicon wafer provided with an antireflection coating film of an organic material in respect of the sensitivity and orthogonality of the cross sectional profile of the patterned resist layer.

In the following, the negative-working chemical- amplification photoresist composition of the present invention is described in more detail by way of Examples, which, however, never limit the scope of the invention in any way. In the Examples given below, the term of "parts" always refers to "parts by weight".

EXAMPLE 1

A negative-working photoresist composition in the form of a solution was prepared by uniformly dissolving, in 600 parts of propyleneglycol monoethyl ether, 100 parts of a copolymer consisting of 85% by moles of hydroxystyrene units and 15% by moles of styrene units and having a weight-average molecular weight of 2500, 5 parts and 0.5 part of tris(2,3-dibromo-propyl) isocyanurate and bis(cyclohexylsulfonyl) diazomethane, respectively, as a combined acid-generating agent, 10 parts of a urea resin (MX-290, a product by Sanwa Chemical Co.), 0.7 part of a melamine resin (MX-750, a product by Sanwa Chemical Co.), 0.12 part of tributylamine, 0.09 part of salicylic acid and a fluorosilicone-based surface active agent (X-70-093, a product by Shin-Etsu Chemical Co.) in an amount of 700 ppm by weight based on the total amount of the non-volatile constituents followed by filtration of the solution through a membrane filter of 0.2 $\mu$m pore diameter.

Separately, a semiconductor silicon wafer of 6 inches diameter was provided on one surface with an antireflection coating film of 110 nm thickness by coating with a coating solution for organic antireflection coating film (SWK-EX3, a product by Tokyo Ohka Kogyo Co.) followed by drying and a baking treatment at 230° C. for 90 seconds.

The thus formed antireflection coating film on the substrate surface was overcoated with a photoresist layer of 0.7 $\mu$m as dried thickness by applying the above prepared photoresist solution on a spinner rotating at 3000 rpm for 30 seconds followed by drying on a hot plate at 100° for 90 seconds. The photoresist layer on the substrate surface was irradiated pattern-wise with a KrF excimer laser beam on a minifying projection exposure machine (Model FPA-3000EX3, manufactured by Canon Co.) followed by a post-exposure baking treatment at 120° for 90 seconds and then subjected to a puddle development treatment with a 2.38% aqueous solution of tetramethylammonium hydroxide at 23° for 65 seconds to give a negatively patterned resist layer.

The results of the evaluation tests of the thus obtained patterned resist layer were that pattern resolution was complete for a line-and-space pattern of 0.18 $\mu$m line/space width and the patterned resist layer had an excellently orthogonal cross sectional profile standing upright on the substrate surface. The minimum exposure dose for obtaining the 0.18 $\mu$m width line-and-space pattern was 100 mJ/cm$^2$ as a measure of the sensitivity.

EXAMPLE 2

The experimental procedure was substantially the same as in Example 1 except that the negative-working photoresist solution was prepared by uniformly dissolving, in a mixture of 420 parts of propyleneglycol monomethyl ether and 180 parts of propyleneglycol monomethyl ether acetate, 100 parts of the same copolymer, 5 parts and 4 parts of tris(2, 3-dibromopropyl) isocyanurate and bis(cyclohexylsulfonyl) diazomethane, respectively, as an acid-generating agent, 10 parts of the same urea resin, 0.7 part of the same melamine resin, 0.12 part of tributylamine, 0.09 part of salicylic acid and the same fluorosilicone-based surface active agent in an amount of 700 ppm by weight based on the total amount of the non-volatile constituents followed by filtration, that the antireflective coating solution SWK-EX3 was replaced with another coating solution SWK-EX2 (a product by Tokyo Ohka Kogyo Co.) and that the resist layer on the substrate surface after drying was subjected to a baking treatment at 180° C. instead of 230° C.

The results of the evaluation tests of the thus obtained patterned resist layer were that pattern resolution was complete for a line-and-space pattern of 0.18 $\mu$m line/space width and the patterned resist layer had an excellently orthogonal cross sectional profile standing upright on the substrate surface. The minimum exposure dose for obtaining the 0.18 pm width line-and-space pattern was 66 mJ/cm$^2$ as a measure of the sensitivity.

EXAMPLE 3

The experimental procedure was substantially the same as in Example 1 except that the negative-working photoresist solution was prepared by replacing the acid-generating agent with a combination of 5 parts of tris(2,3-dibromo-4-chlorobutyl) isocyanurate, 4 parts of tris(2,3-dibromopropyl) isocyanurate and 0.5 part of bis(cyclohexylsulfonyl) diazomethane.

The results of the evaluation tests of the thus obtained patterned resist layer were that pattern resolution was complete for a line-and-space pattern of 0.19 pm line/space width and the patterned resist layer had an excellently orthogonal cross sectional profile standing upright on the substrate surface. The minimum exposure dose for obtaining the 0.19 pm width line-and-space pattern was 38 mJ/cm$^2$ as a measure of the sensitivity.

Comparative Example 1

The experimental procedure was substantially the same as in Example 1 except that the negative-working photoresist solution was prepared by replacing the combined acid-generating agent with 5 parts of tris(2,3-dibromopropyl) isocyanurate alone.

The results of the evaluation tests of the thus obtained patterned resist layer were that pattern resolution was complete only for a line-and-space pattern of 0.21 μm or broader line/space width and the patterned resist layer had a cross sectional profile which was approximately orthogonal standing upright on the substrate surface but was rounded at the shoulders. The minimum exposure dose for obtaining the 0.21 μm width line-and-space pattern was 120 mJ/cm$^2$ as a measure of the sensitivity.

Comparative Example 2

The experimental procedure was substantially the same as in Example 2 except that the negative-working photoresist solution was prepared by replacing the combined acid-generating agent with 4 parts of bis(cyclohexylsulfonyl) diazomethane alone.

The results of the evaluation tests of the thus obtained patterned resist layer were that pattern resolution was complete only for a line-and-space pattern of 0.21 μm or broader line/space width and the patterned resist layer had a cross sectional profile which was not orthogonal but upwardly narrowing trapezoidal standing on the substrate surface and was rounded at the shoulders. The minimum exposure dose for obtaining the 0.21 pm width line-and-space patter was 94 mJ/cm$^2$ as a measure of the sensitivity.

Comparative Example 3

The experimental procedure was substantially the same as in Example 2 except that the amount of bis (cyclohexylsulfonyl) diazomethane was increased from 4 parts to 15 parts in the preparation of the negative-working photoresist solution.

As a result of the storage stability test of the thus prepared photoresist solution undertaken at −20° C., a substantial amount of precipitates were found in the solution after 3 days of storage.

What is claimed is:

1. A negative-working chemical-amplification photoresist composition, as a uniform solution in an organic solvent, which comprises:

(A) an alkali-soluble resin;

(B) an acid-generating agent capable of releasing an acid by irradiation with actinic rays; and (C) a crosslinking agent, the acid-generating agent as the component (B) being a combination of a halogenoacid-generating compound and a bis(alkylsulfonyl) diazomethane compound in a proportion in the range from 20:1 to 1:2 by weight.

2. The negative-working chemical-amplification photoresist composition as claimed in claim 1 in which the tris (halogeno-alkyl) isocyanurate is tris(2,3-dibromopropyl) isocyanurate or tris(2,3-dibromo-4-chlorobutyl) isocyanurate.

3. The negative-working chemical-amplification photoresist composition as claimed in claim 1 in which the bis (alkyl-sulfonyl) diazomethane is bis(cyclohexyloxy) diazomethane.

4. The negative-working chemical-amplification photoresist composition as claimed in claim 1 in which the alkali-soluble resin as the component (A) is selected from the group consisting of phenol novolak resins, cresol novolak resins and polymers of hydroxystyrene substituted for a part of the hydroxyl groups by alkali solubility-reducing groups.

5. The negative-working chemical-amplification photoresist composition as claimed in claim 5 in which the alkali-soluble resin as the component (A) is a copolymer of hydroxystyrene and styrene in a molar proportion in the range from 70:30 to 95:5 and has a weight-average molecular weight in the range from 2000 to 4000.

6. The negative-working chemical-amplification photoresist composition as claimed in claim 1 in which the halogen in the tris(halogenoalkyl) isocyanurate is chlorine or bromine.

7. The negative-working chemical-amplification photoresist composition as claimed in claim 1 in which the alkyl group in the bis(alkylsulfonyl) diazomethane compound has from 3 to 7 carbon atoms.

8. The negative-working chemical-amplification photoresist composition as claimed in claim 1 in which the weight proportion of the tris(halogenoalkyl) isocyanate and the bis(alkylsulfonyl) diazomethane compound as the component (B) is in the range from 10:1 to 10:8.

9. The negative-working chemical-amplification photoresist composition as claimed in claim 1 in which the crosslinking agent as the component (C) is selected from the group consisting of N-methylolated and N-alkoxymethylated melamine resins and N-methylolated and N-alkoxymethylated urea resins.

10. The negative-working chemical-amplification photoresist composition as claimed in claim 9 in which the crosslinking agent as the component (C) is a combination of the N-methylolated or N-alkoxymethylated melamine resin and the N-methylolated or N-alkoxymethylated urea resin.

11. The negative-working chemical-amplification photoresist composition as claimed in claim 1 in which the amount of the component (B) is in the range from 0.5 to 30 parts by weight based on 100 parts by weight of the component (A).

12. The negative-working chemical-amplification photoresist composition as claimed in claim 1 in which the amount of the component (C) is in the range from 3 to 70 parts by weight based on 100 parts by weight of the component (A).

13. The negative-working chemical-amplification photoresist composition as claimed in claim 1 which further comprises: (D) a secondary or tertiary amine compound in an amount in the range from 0.001 to 10 parts by weight per 100 parts by weight of the component (A).

14. The negative-working chemical-amplification photoresist composition as claimed in claim 13 which further comprises: (E) a carboxylic acid compound in an amount in the range from 0.001 to 10 parts by weight per 100 parts by weight of the component (A).

* * * * *

UNITED STATES PATENT AND TRADEMARK OFFICE
CERTIFICATE OF CORRECTION

PATENT NO. : 6,171,749 B1
DATED : January 9, 2001
INVENTOR(S) : Toshikazu Tachikawa et al.

It is certified that error appears in the above-identified patent and that said Letters Patent is hereby corrected as shown below:

Column 4,
Line 40, change "bis (isopro-pylsulfonyl)" to -- bis (isopropylsulfonyl --.

Column 9,
Lines 45-46, change "halogenoacid-generating compound" to -- tris (halogenoalkyl) isocyanate --.
Line 51, change "(halogeno-alkyl)" to -- (halogenoalkyl) --.
Line 56, change "(alkyl-sulfonyl)" to -- (alkylsulfonyl) -- and change "bis (cyclohexyloxy)" to -- bis (cyclohexylsulfonyl) --.

Column 10,
Line 8, change "claim 5" to -- claim 4 --.

Signed and Sealed this

Eighteenth Day of December, 2001

Attest:

*Attesting Officer*

JAMES E. ROGAN
*Director of the United States Patent and Trademark Office*